United States Patent [19]

Durham et al.

[11] Patent Number: 5,790,560
[45] Date of Patent: Aug. 4, 1998

[54] APPARATUS AND METHOD FOR TIMING SELF-TIMED CIRCUITRY

[75] Inventors: Christopher McCall Durham; Peter Juergen Klim, both of Austin, Tex.

[73] Assignee: International Business Machines Corporation, Armonk, N.Y.

[21] Appl. No.: 767,247

[22] Filed: Dec. 13, 1996

[51] Int. Cl.[6] ................................................. G01R 31/28
[52] U.S. Cl. ........................................ 371/22.1; 365/201
[58] Field of Search ............................... 371/22.1, 22.5, 371/27.1, 27.5; 365/201, 236, 191, 189.01; 377/39, 56; 395/550, 185.04, 182.16, 575

[56] References Cited

U.S. PATENT DOCUMENTS

| | | | |
|---|---|---|---|
| 5,263,143 | 11/1993 | Robinson et al. | 395/425 |
| 5,418,754 | 5/1995 | Sakakibara | 365/222 |
| 5,446,695 | 8/1995 | Douse et al. | 365/222 |
| 5,506,878 | 4/1996 | Chiang | 377/39 |
| 5,544,342 | 8/1996 | Dean | 395/446 |
| 5,553,276 | 9/1996 | Dean | 395/550 |
| 5,619,512 | 4/1997 | Kawashima et al. | 371/22.5 |
| 5,629,946 | 5/1997 | Takano | 371/27 |
| 5,651,014 | 7/1997 | Kobayashi | 371/27 |

*Primary Examiner*—Robert W. Beausoliel, Jr.
*Assistant Examiner*—Nadeem Iqbal
*Attorney, Agent, or Firm*—Winstead Sechrest & Minick P.C.; Anthony V. S. England; Robert D. McCutcheon

[57] ABSTRACT

A method and apparatus for timing self-timed circuitry measures the cycle time of a self-timed system or circuit. An input pattern generator generates a plurality of data input patterns that are sequentially input to the self-timed system or circuit. A valid output signal, generated after the self-timed system or circuit produces output signal(s) in response to each data input pattern and signals the input pattern generator to change the input to the next data input pattern. A timer measures the total amount of time required for the self-timed system or circuit to generate output signal(s) in response to the sequential input of each of the data input patterns. A counter counts the number of times a valid output signal is generated as the apparatus loops through each of the data input patterns. The timer result is divided by the counter result to determine the average cycle time (time delay) of a self-timed system or circuit across multiple data input patterns.

20 Claims, 2 Drawing Sheets

APPARATUS AND METHOD FOR TIMING SELF-TIMED CIRCUITRY

CROSS-REFERENCE TO RELATED PATENTS

Related subject matter may be found in the following commonly assigned U.S. Patents, both of which are hereby incorporated by reference herein:

U.S. Pat. No. 5,553,276, issued on Sep. 3, 1996 (Ser. No. 08/299,035 filed Aug. 31, 1994) and entitled "Self-Time Processor with Dynamic Clock Generator Having Plurality of Tracking Elements for Outputting Sequencing Signals to Functional Units"; and U.S. Pat. No. 5,544,342, issued on Aug. 6, 1996 (Serial No. 08/501,244 filed Jul. 10, 1995) and entitled "System and Method for Prefetching Information in a Processing System."

TECHNICAL FIELD OF THE INVENTION

The present invention relates to an apparatus and method for timing self-timed circuitry and, in particular, to an apparatus and method for measuring operational speed or cycle time, of a self-timed circuit or system.

BACKGROUND OF THE INVENTION

Utilization of self-timed circuits and systems (and design techniques) is becoming an increasingly important and major component of very large scale integrated (VLSI) circuits. Self-timed circuits exhibit many beneficial characteristics over circuits that rely on clocked signals. For example, self-timed circuits consume less power than clocked circuits because they operate only when necessary. Self-timed circuits are maintained in a standby mode until such time as inputs to the circuit are asserted thereby requiring operation of the circuit. In contrast, clocked circuits consume power even when idle due to the clock switching and/or the operation of additional circuitry used to deactivate the clock signals altogether.

However, self-timed circuits have several problems. A major problem arises when the self-timed circuit is tested to determine the actual cycle time and/or operational speed. Importantly, the predicted cycle time of the self-timed circuit or system must be compared to the actual cycle time of the fabricated circuit or system in order to verify that the cycle time of the self-timed circuit properly lies within the desired specifications to ensure proper integration into the overall system. Another related problem is that of interfacing the self-timed circuit to a standard clocked system or circuit. This may require additional complex circuitry to provide integration.

Generally, self-timed circuits and systems are tested using a clocked test system. Accordingly, an interface is required between the self-timed circuit and the clocked test system. As described earlier, such interfacing typically requires additional complex circuitry, which increases the overhead costs associated with the clocked test system. In order to verify the results of the self-timed circuit with the predicted results, testing is normally done at a slow rate for the purpose of determining or verifying functionality. A slow speed allows the self-timed system to cycle through a test operation and produce the results without regard to the clocked test system interface.

Speed of operation, or cycle time, must also be verified to insure that the self-timed system performs within specified speed parameters. This presents difficulty for the interface between the self-timed system and the clocked test system. Generally, the self-timed system produces results at a rate determined by the model plus or minus any tolerances caused by the fabrication process, slight model inaccuracies, etc. Because the time period required to produce the resulting output from the input data is independent of the clocked test system clock frequency, a substantial probability exists that the result and the clock frequency will not be synchronized. For example, if the self-timed circuitry were to operate (on a given set of input data) faster than the model prediction, then the clocked test system may not properly indicate such a result if the tester relied on the next clock sampling period for the determination. Conversely, if the self-timed circuit operated slowly, then the clocked test system may not recognize that the proper operation occurred, only at a lower frequency.

Additionally, the aforementioned problems are further complicated due to the dependency of the operational speed, or cycle time, of the self-timed circuit on the states of the data input signals (i.e., different data input patterns for different operations of the circuitry, or different data input patterns to be operated upon by the self-timed circuit). Different data input patterns may result in different evaluation times (i.e., period of time from input to a valid output), either by design or due to random effects, and may affect the measurement by the clocked test system.

Accordingly, there exists a need for an apparatus and method for testing or measuring operational speed, or cycle time, of a self-timed circuit or system. Further, there is needed an apparatus and method for testing operational speed, or cycle time, of a self-timed circuit or system without the need for a clocked testing system. Additionally, there is needed an apparatus and method for determining the average time delay, or cycle time, of a self-timed circuit or system in response to multiple data input signals or patterns.

SUMMARY OF THE INVENTION

According to the present invention, there is provided a circuit operable for measuring cycle time of a self-timed circuit. The circuit includes circuitry for generating a data input signal pattern for input to a self-timed circuit in response to a start signal. The circuit also includes a timer circuit that measures a period of time in response to the start signal and the stop signal and outputs a timer value. The stop signal is generated in response to a valid output signal generated by the self-timed circuit. The timer value indicates cycle time of the self-timed circuit responsive to the data input signal pattern.

In accordance with the present invention, a loop timing circuit is provided for measuring cycle time of a self-timed circuit. The loop timing circuit includes circuitry for generating a plurality of data input signal patterns for sequential input to a self-timed circuit with the plurality of data input signals including a first input pattern and a last input pattern. A last input pattern detector circuit detects or recognizes the last input pattern and generates a first signal in response thereto. A counter circuit counts the number of times a valid output signal is generated by the self-timed circuit and outputs a count value. A timer circuit measures the period of time in response to a start signal and a stop signal and outputs a timer value. The stop signal is generated in response to the first signal and the valid output signal. From the timer value and the count value, an average cycle time of the self-timed circuit across the plurality of data input signal patterns can be calculated.

In accordance with the present invention, there is provided a method for determining average cycle time of a self-timed system. The method includes the step of generating and sequentially applying a plurality of input data patterns for input to a self-timed circuit wherein the plurality of input data patterns has at least a first input data pattern and a last input data pattern. The self-timed circuit is operated for each of the plurality of input data patterns applied to the self-timed circuit and a valid output signal is generated in response to completion of operation of the self-timed circuit for each of the plurality of input data patterns. The method also includes the steps of generating a counter result equalling the number of times a valid output signal is generated by the self-timed circuit and generating, using a timer, a timer result substantially equalling the sum of each time of operation of the self-timed circuit for each of the plurality of input data patterns. With the counter result and the timer result, the average cycle time of the self-timed circuit can be calculated.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWING

For a more complete understanding of the present invention, and the advantages thereof, reference is made to the following description taken in conjunction with the accompanying drawings, wherein.

DETAILED DESCRIPTION OF THE INVENTION

Figure 1:
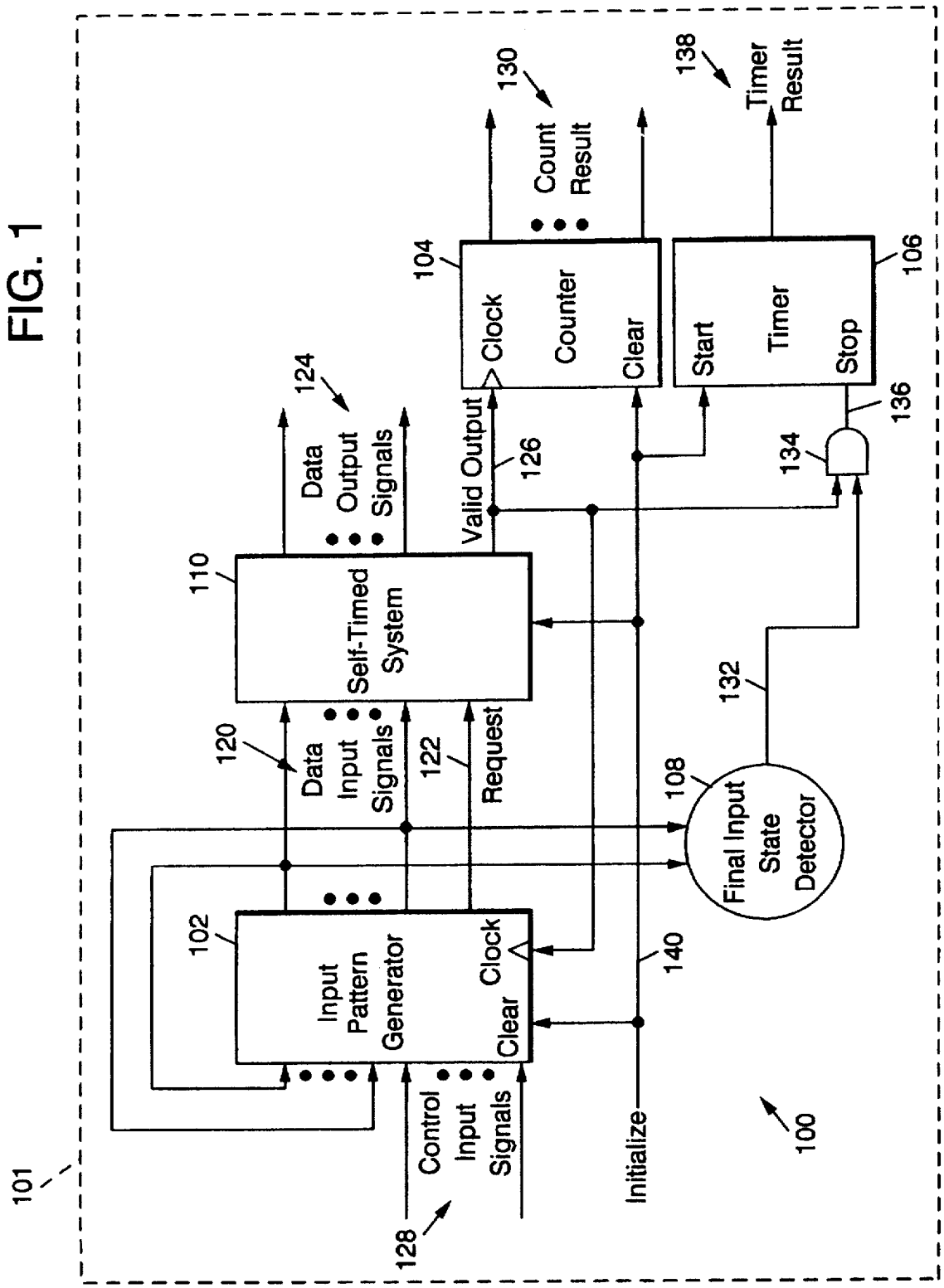
FIG. 1 illustrates a diagram of a loop timing measurement circuit or system for timing a self-timed circuit or system in accordance with the present invention.

With reference to the drawings, like reference characters designate like or similar elements throughout the drawings.

Now referring to FIG. 1, there is shown a loop timing circuit 100 in accordance with one embodiment of the present invention. The loop timing circuit 100 includes an input pattern generator 102, a counter 104, a timer 106 and a final input state detector 108. Additionally shown in FIG. 1 is a self-timed circuit or system 110. The self-timed circuit or system 110 is not a component of the loop timing circuit 100, but instead is the subject circuit or system desired to be tested or measured. The design, implementation and/or function of the self-timed system 110 is not the subject of this application. Such a system or circuit 110 can be designed or implemented as desired, with any desired function, by persons of ordinary skill in the art. As will be appreciated, the loop timing circuit 100 and the self-timed system 110 can be fabricated on a semiconductor substrate 101.

The loop timing circuit 100 interfaces with the self-timed system 110 and provides a method and mechanism for timing the self-timed system 110. The loop timing circuit 100 generates a count result and a timer result that is used to determine the operational speed of the self-timed system 110. As will be appreciated, the operational speed of the self-timed system 110 may also be referred to as the cycle time, delay time, or evaluation delay or time. This is defined as the amount of elapsed time beginning from application of an input to the self-timed system 110 (and start of operation of the self-timed system) to completion of the operation of the self-timed system 110 where the output generated therefrom is valid (stable).

The input pattern generator 102 generates and outputs data input signals 120 for application (or input) to the self-timed system 110 and the final input state detector 108. A request signal 122 is also generated by the input pattern generator 102 and signals the self-timed system 110 to begin operation and produce data output signals 124. When the data output signals 124 are valid (stable), the self-timed system 110 generates a valid output signal 126 which is a signal commonly generated by self-timed systems and the like when their outputs signals are valid.

Typically, a plurality of data input signals 120 (or data input patterns) are generated by the input pattern generator 102 for sequential input to the self-timed system 110. The input pattern generator 102 may generate any number of valid data input patterns for input to the self-timed system 110. For each data input pattern, the self-timed system 110 performs an operation on that particular data input pattern, or performs an operation identified by the particular data input pattern, and generates output signals 124 accordingly. When the self-timed system 110 completes its operation (and the output signals are valid), the valid output signal 126 is generated. The valid output signal 124 indicates to the input pattern generator 102 that the self-timed system 110 has completed its operation on the current data input pattern thereby causing the input pattern generator 102 to generate another data input pattern (or set of data input signals 120) for application to the self-timed system 110. As will be appreciated, the number of data input patterns generated by the input pattern generator 102 can range from one to millions, depending on the desired number and combination of input signals 120 to the self-timed system 110 and the system's function and operation.

In an embodiment of the present invention illustrated in FIG. 1, the input pattern generator 102 is implemented as a state machine. The data input signals 120 generated are fed back in a closed loop configuration, input to the input pattern generator 102, and used to sequence through the set of data input patterns desired. The design of a state machine to perform the desired function when the desired data input patterns are given is well known and understood by those skilled in the data programming art. As will be appreciated, the input pattern generator 102 could also be implemented using a processor and random access memory and the like. It will be understood that any circuitry may be designed and implemented to perform the desired function of generating a plurality (or set) of data input patterns for sequential input to the self-timed system 110. Additionally, optional control input signal lines 128 may be provided for flexibility in programming/controlling the input pattern generator 102.

The loop timing circuit 100 includes the counter 104 for counting the number of times the valid output signal 126 is generated by the self-timed system 110. Each time the valid output signal 126 is generated, the counter 104 is incremented. Accordingly, the counter 104 counts the number of times the self-timed system 110 completes a valid operation and provides a count result 130 indicating the number of times the valid output signal 126 is generated.

The loop timing circuit 100 also includes the timer 106 for measuring the elapsed time from application of the first data input pattern until the completion of operation of the self-timed system 110 with respect to the last data input pattern. Typically, the data input signals 120 are generated sequentially starting with a first data input pattern and ending with a last data input pattern, and may range from one pattern to millions of patterns. The timer 106 functions in conjunction with the final input state detector 108 and the valid output signal 126. As the loop timing circuit 100 sequences through the set of data input patterns, the input pattern generator 102 will eventually reach the last data input pattern. The final input state detector 108 recognizes or detects when the last data input pattern is generated. In response thereto, a final state signal 132 is generated and input to an AND gate 134. Upon completion of operation of the self-timed system 110 on the final data input pattern, the valid output signal 126 is generated and input to the AND gate 134. It will be understood that when the final data input pattern is reached and the valid output signal 126 is asserted, a stop signal 136 is generated which stops the timer 106. The timer 106 generates a timer result 138 or time value in standard units (hours, minutes, seconds, etc.).

Additionally, the final input state detector 108 may be designed to cycle through the set of data input patterns more than once. This may allow for a more accurate measurement and increase the total number of patterns cycled through the self-timed system.

It will be appreciated by those skilled in the art that the counter 104, the timer 106 and the final input state detector 108 can be designed using many different structures and/or techniques as desired. Additionally, an optional initialization signal 140 may be provided, as shown in FIG. 1, for setting the input pattern generator to the first data input pattern, setting the counter 104 to a value of zero, starting the timer 106 and resetting the self-timed system 110.

In accordance with the present invention, a counting/timing system and method is shown that counts the number of valid results from the self-timed system and measures the elapsed time required to generate these valid results. The input pattern generator 102 generates a set of data input patterns and sequentially inputs each data input pattern to the self-timed system 110 each time a function (or operation) has been completed on the previous data input pattern. The present invention utilizes the inherent function of a self-timed system as it produces a valid output signal which signals that an operation has been completed and a new data input pattern can be generated.

Figure 2:
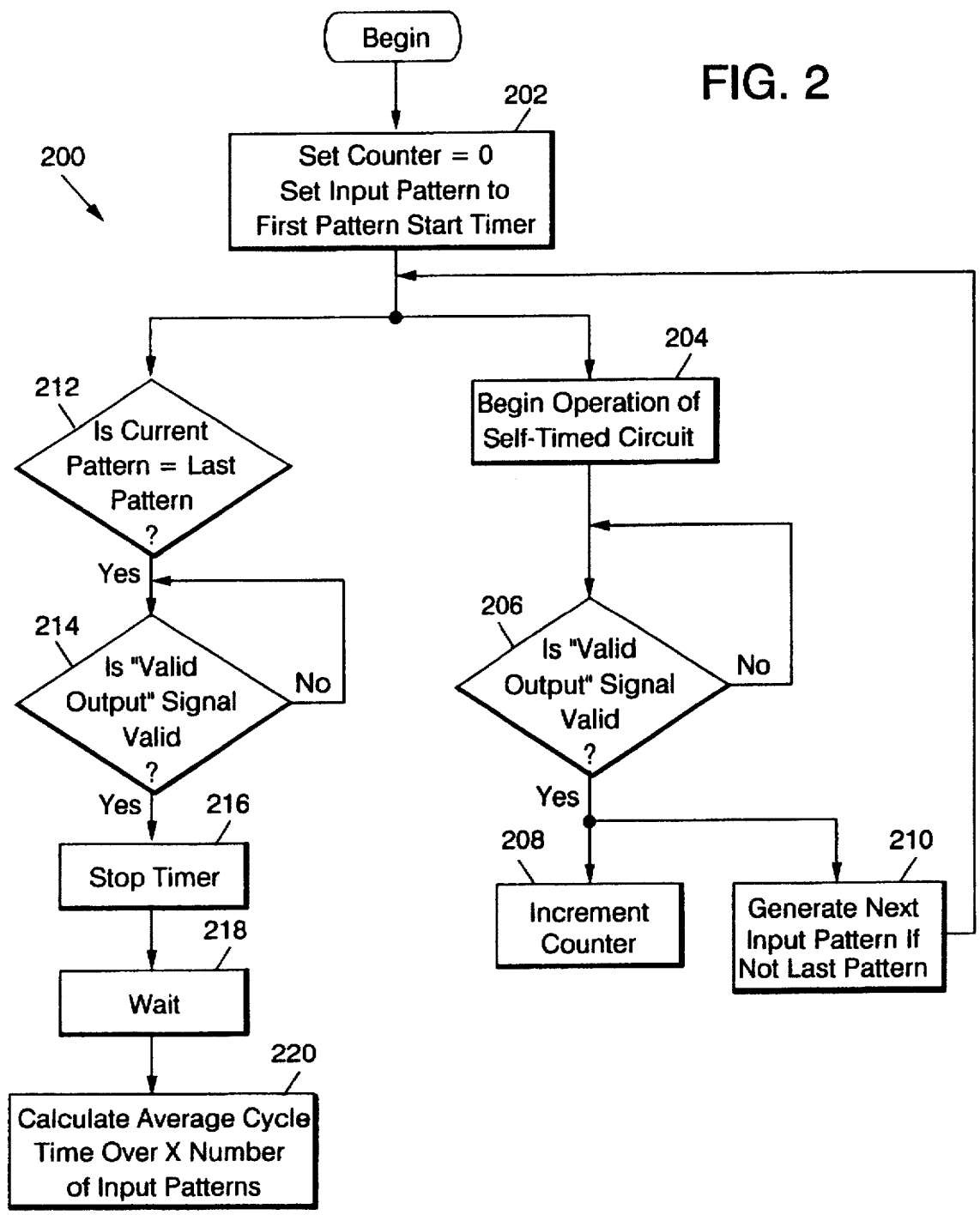
FIG. 2 illustrates a flow diagram of a method of measuring operational speed, or cycle time, of a self-timed circuit or system.

Now referring to FIG. 2, there is illustrated a method 200 for measuring cycle time of a self-timed system or circuit. At an initialization step 202, the initialization signal 140 sets the input pattern generator 102 to the first data input pattern, sets the counter 104 to zero value, and resets the self-timed system 110, if needed. The step 202 also starts the timer 106. At a step 204, the input pattern generator 102 signals, via the request signal 122, to the self-timed system 110 to commence operation in response to the first data input pattern. Next, at a step 206, the valid output signal 126 is generated after some period of time by the self-timed system 110. This indicates that the output signals 124 are valid and stable. Generation of the valid output signal 126 increments the counter 104 at a step 208 and concurrently, at a step 210, causes the input pattern generator 102 to generate the next input data pattern thereby changing the input signals 120 to the self-timed system 110. Upon completion of the step 210, steps 204, 206, 208 and 210 are repeated for the next data input pattern, and so on, through the last data input pattern generated by the input pattern generator 102.

Occurring concurrently with steps 204 through 210, is a step 212, whereby the final input state detector 108 determines or detects whether the current data input pattern generated by the input pattern generator 102 is equal to the known last data input pattern. If the last data input pattern is detected, then the final state signal 132 is generated and input to the AND gate 134. At a next step 214, when the valid output signal 126 is generated (indicating that the self-timed system 110 has completed operation), the process continues with a step 216. At the step 216, the stop signal 136 is generated which stops the timer 106. At this point, the timing sequence is complete. An optional step 218 comprising a short delay (or wait) may be required before the count result 130 and the timer result 138 are available for use. After the timing sequence is completed, average cycle time of the self-timed system 110 can be calculated by dividing the total timer result 138 by the total count result 130, at step 220.

Accordingly, the apparatus and method of the present invention determines the average cycle time (or time delay) of a self-timed system across multiple data input patterns. The foregoing described apparatus and method allows cycle time measurements of a self-timed system without the need for any clocked circuitry or clock synchronization.

Generally, the larger the number of data input patterns used, the more accurate result of the average cycle time will be achieved for a given self-timed system. The loop timing circuit 100 times itself without the need for a clocked system or clocked system interface. As will be appreciated, the present invention may also be used to determine cycle time of a self-timed system for a single data input pattern. This can be achieved by designing/programming the input pattern generator to generate only a single data input pattern and measuring the time period for the self-timed system to complete operation.

Although the present invention and its advantages have been described in the foregoing detailed description and illustrated in the accompanying drawings, it will be understood by those skilled in the art that the invention is not limited to the embodiment(s) disclosed but is capable of numerous rearrangements, substitutions and modifications without departing from the spirit and scope of the invention as defined by the appended claims.

What is claimed is:

1. A circuit operable for measuring cycle time of a self-timed circuit that generates a valid output signal when the output of the self-timed circuit is valid, the circuit comprising:

circuit means operable for generating a data input signal pattern for input to a self-timed circuit in response to a start signal; and a timer circuit operable for measuring a period of time in response to the start signal and the valid output signal and outputting a timer value corresponding to the measured period of time, the timer value indicating cycle time of the self-timed circuit from the time when the data input signal pattern is applied to the self-timed circuit to the time the valid output signal is generated by the self-timed circuit.

2. The circuit in accordance with claim 1 wherein the circuit means is fabricated on a semiconductor substrate, the timer circuit is fabricated on the substrate, and the self-timed circuit is fabricated on the substrate.

3. The circuit in accordance with claim 1 wherein the circuit means for generating comprises a state machine.

4. The circuit in accordance with claim 1 wherein the circuit means for generating comprises a processor and a memory.

5. A circuit operable for measuring cycle time of a self-timed circuit that generates a valid output signal, comprising:

circuit means operable for generating a plurality of data input signal patterns for sequential input to a self-timed circuit in response to a start input signal, the plurality of data input signal patterns including at least a first data input pattern and a last data input pattern, and the circuit means for generating further comprises circuit means for counting a number of times the valid output signal is generated by the self-timed circuit and outputting a count value; and a timer circuit operable for measuring a period of time in response to the start signal and a stop signal and outputting a timer value, the timer value indicating cycle time of the self-timed circuit in response to the data input signal patterns.

6. The circuit in accordance with claim 5 further comprising:

last input pattern detector circuit detecting the last data input pattern and generating a first signal in response thereto; and logic means generating the stop signal in response to the valid output signal and the first signal, and wherein the count value divided by the timer value determines an average cycle time of the self-timed circuit across the plurality of data input signal patterns.

7. The circuit in accordance with claim 6 wherein the circuit means for generating comprises a state machine.

8. The circuit in accordance with claim 6 wherein the circuit means for generating comprises a processor and a memory.

9. The circuit in accordance with claim 6 wherein the circuit means for generating is fabricated on a substrate, the timer circuit is fabricated on the substrate, the circuit means for counting is fabricated on the substrate, the last input pattern detector circuit is fabricated on the substrate, and the self-timed circuit is fabricated on the substrate.

10. A loop timing circuit operable for measuring cycle time of a self-timed circuit, comprising:

circuit means for generating a plurality of data input signal patterns for sequential input to a self-timed circuit, the plurality of data input signals including a first input pattern and a last input pattern;

a last input pattern detector circuit for detecting the last input pattern and generating a first signal in response thereto;

a counter circuit counting a number of times a valid output signal is generated by the self-timed circuit and outputting a count value;

a logic circuit for generating a stop signal in response to the first signal and the valid output signal; and a timer circuit measuring a period of time in response to a start signal and a stop signal and outputting a timer value, the timer value divided by the count value determines an average cycle time of the self-timed circuit across the plurality of data input signal patterns.

11. The loop timing circuit in accordance with claim 10 wherein the circuit means for generating is fabricated on a substrate, the timer circuit is fabricated on the substrate, the counter circuit is fabricated on the substrate, the last input pattern detector circuit is fabricated on the substrate, and the self-timed circuit is fabricated on the substrate.

12. The loop timing circuit in accordance with claim 10 wherein the circuit means for generating comprises a state machine.

13. The loop timing circuit in accordance with claim 10 wherein the circuit means for generating comprises a processor and a memory.

14. The loop timing circuit in accordance with claim 10 wherein an initialization signal sets the counter circuit to a value of zero and sets the circuit means for generating to the first input pattern.

15. A method for determining an average cycle time of a self-timed system, comprising the steps of:

generating and sequentially applying a plurality of input data patterns for input to a self-timed circuit, the plurality of input data patterns having at least a first input data pattern and a last input data pattern;

operating the self-timed circuit for each of the plurality of input data patterns applied to the self-timed circuit;

generating a valid output signal in response to completion of operation of the self-timed circuit for each of the plurality of input data patterns;

generating a counter result equalling a number of times a valid output signal is generated by the self-timed circuit;

generating, using a timer, a timer result substantially equalling the sum of each time of operation of the self-timed circuit for each of the plurality of input data patterns; and calculating the average cycle time of the self-timed circuit.

16. The method in accordance with claim 15 wherein the step of calculating the average cycle time of the self-timed circuit includes the step of dividing the timer result by the counter result.

17. The method in accordance with claim 15 further including the step of setting the counter result to zero, setting the plurality of input data patterns to the first input data pattern, and starting the timer, all in response to an initialization signal.

18. The method in accordance with claim 15 wherein the step of generating and applying a plurality of input data patterns for input to a self-timed circuit includes a step of sequentially applying a next one of the plurality of input data patterns in response to the valid output signal, and repeating this step, until the last input data pattern is applied.

19. The method in accordance with claim 18 wherein the step of generating a timer result includes the steps of:

detecting application of the last input data pattern and generating a first signal in response thereto; and stopping the timer in response to the first signal and the valid output signal.

20. A method for determining average cycle time of a self-timed system, comprising the steps of:

generating and sequentially applying a plurality of input data patterns for input to a self-timed circuit, the plurality of input data patterns having at least a first input data pattern and a last input data pattern;

starting a timer in response to the generation and application of the first input data pattern to the self-timed circuit;

applying a next one of the plurality of input data patterns in response to a valid output signal generated by the self-timed circuit, and repeating this step until the last input data pattern is generated and applied;

generating a counter result equalling a number of times a valid output signal is generated by the self-timed circuit during the generation and application of the plurality of input data patterns to the self-timed circuit;

recognizing that the last input data patterns has been reached and generating a first signal in response thereto;

stopping the timer in response to the first signal and the valid output signal to generate a timer value; and calculating the average cycle time of the self-timed circuit by dividing the timer value by the counter result.

* * * * *